United States Patent

Widmann et al.

[15] 3,644,134

[45] Feb. 22, 1972

[54] CONTACT EXPOSURE MASK FOR THE SELECTIVE EXPOSURE OF PHOTOVARNISH COATINGS FOR SEMICONDUCTOR PURPOSES

[72] Inventors: Dietrich Widmann, Munich; Rudolf Kappelmeyer, Oberhaching; Kurt Schluter; Hermann Steggewentz, both of Munich, all of Germany

[73] Assignee: Siemens Aktiengesellschaft, Berlin and Munich, Germany

[22] Filed: Dec. 11, 1968

[21] Appl. No.: 783,784

[30] Foreign Application Priority Data

Dec. 12, 1967 Germany ....................P 16 14 677.3

[52] U.S. Cl. ....................117/45, 29/578, 96/84, 117/71, 204/192

[51] Int. Cl. ....................B44d 1/14, G03c 1/84, C23c 15/00

[58] Field of Search ....................204/192; 117/45, 71 R; 96/36.2; 29/578

[56] References Cited

UNITED STATES PATENTS 3,189,973 6/1965 Edwards et al....................29/578 X
3,271,488 9/1966 Dahlberg....................204/192 X

OTHER PUBLICATIONS

Defensive Publication, Ser. No. 571,633, Oliver, published Nov. 26, 1968, 856 O.G. 1019

*Primary Examiner*—John H. Mack
*Assistant Examiner*—Neil W. Kaplan
*Attorney*—Curt M. Avery, Arthur E. Wilfond, Herbert L. Lerner and Daniel J. Tick

[57] ABSTRACT

Described is a contact exposure mask for selective exposure of photovarnish layers for semiconductor fabricating purposes. The contact exposure mask consists of a metallized layer which is deposited upon a carrier plate of transparent, hard material and is provided with exposure windows. The metallized layer is covered by a layer of transparent, hard material having a thickness of at most 3 microns.

5 Claims, 2 Drawing Figures

CONTACT EXPOSURE MASK FOR THE SELECTIVE EXPOSURE OF PHOTOVARNISH COATINGS FOR SEMICONDUCTOR PURPOSES

In semiconductor fabrication, aside from using the method of optical projection or illumination of photosensitive varnish coatings to be exposed, increasing use has been made of effecting such exposure with the aid of contact masks pressed against the photovarnish coating. Such a mask consists of a plate, which is transparent to radiation and has impermeable localities, for example a plate of quartz or glass. Such a plate is placed upon an unexposed photovarnish, also called "photoresist," coating deposited upon a substrate, particularly upon a semiconductor wafer. During exposure, the radiation or illumination impinges upon the photovarnish coating only through the transparent localities of the contact mask. These exposed localities then constitute the desired ultimate mask after photographically developing the varnish layer. The ultimate mask is employed, for example, as an etching mask or vapor deposition mask.

In view of the accuracy and the fine details to be produced with such a photovarnish mask for semiconductor techniques, the illumination employed must meet most exacting requirements with respect to accuracy. It will be understood, therefore, that among other things such optical phenomena as may cause a "exposure structure" as is the case when diffraction and interference take place, are undesired.

One can produce a photovarnish mask for semiconductor fabricating purposes, by selectively illuminating a photovarnish coating deposited upon a carrier and after exposure removing portions of the photovarnish coating by photographic development. The selective photoexposure is performed by applying a contact exposure mask shaped in accordance with the desired exposure geometry. This contact mask consists of a transparent plate, which has an opaque surface coating with exposure windows in the coating. Such a contact exposure mask can be provided with antireflex coatings for minimizing the occurrence of "illumination structure" due to interference phenomena.

Referring to such a method, it is an object of our invention to achieve further improvements of the contact exposure masking process in optical respects.

Another object is to simplify cleaning the mask surface with the aid of ordinary cleaning fluids.

Still another object of the invention is to secure an improved stability of the mask dimensions and to prolong the useful lifetime of the mask.

According to our invention, we provide, for the selective exposure of photovarnish layers by semiconductor techniques, a contact exposure mask. This mask comprises a carrier plate of transparent hard material coated by metallization which in turn is provided with exposure windows. The contact exposure mask is further provided at the metallized side with a coating of transparent hard material having a thickness of at most 3 microns and is produced by deposition from the gaseous phase or by spattering.

Figure 1:
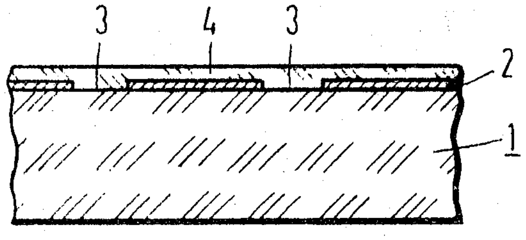
Figure 2:
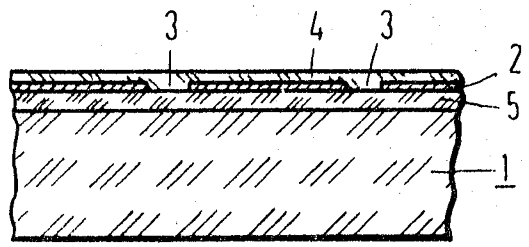

The invention will be further elucidated with reference to the accompanying drawing showing by way of example two embodiments of exposure masks according to the invention, FIG. 1 showing a first embodiment in cross section and FIG. 2 shows a second embodiment also in cross section. Both embodiments show only part of the exposure mask on a greatly enlarged scale and are provided with the same reference numerals for items corresponding respectively.

The mask according to FIG. 1 comprises a polished, planar-parallel, transparent carrier plate 1 of quartz. The plate may also consist of other transparent hard materials such as $Al_2O_3$, SiC, BeO or hardened glass. A metallization 2 which constitutes the mask proper and consists for example of chromium, molybdenum or aluminum, is deposited upon one of the polished side faces of this plate. The deposition is effected, for example, by vaporization or cathode sputtering, followed by tempering, for example at 300° C., for hardening the deposited coating. When depositing this mask, it is preferable to already employ a photovarnish technique for producing the exposure windows 3. The metallized coating is covered by a thin surface coat 4 having a thickness of 1.5 microns. This coating is also deposited from the vaporous or pulverulent state and consists of $SiO_2$. The metallized coating 2 has a thickness of at most 0.5 microns, for example of from 0.10 to 0.15 microns. When using the mask on the photovarnish coating, absolutely sharp illumination contours are secured even with the smallest applicable dimensions of the exposure windows 3, without appreciable or discernible disturbance by interference or diffraction phenomena.

The mask device illustrated in FIG. 2 differs from that of FIG. 1 only in that a polished glass plate 1 is employed as a carrier whose polished side face carries a quartz layer 5 deposited in the constitution of dust, for example by sputtering. The quartz layer 5 carries a metallized layer 2, provided with exposure windows 3 and covered with a $SiO_2$ coating 4 which is deposited in dust or powder constitution.

It is essential that the coating and layer material and the carrier material have similar hardness. It is also preferable that the carrier plate, at least adjacent to the layers on the polished face, and the material of the thin surface coating, have substantially the same thermal coefficient of expansion. Suitable materials for both components are, among others, $SiO_2$, $Al_2O_3$, SiC, BeO. The carrier plate at the face carrying the metal layer is preferably covered with a harder layer. The deposition of the hard carrier layer in a mask device according to FIG. 2, the deposition of the metal layers 2 and/or of the top coating 4 can be effected by vaporization or by thermal segregation from a reaction gas and precipitation onto the heated carrier. If deposition of the metal layer, for example a chromium layer, is effected at a relatively low temperature, it is preferable to temper the metal layer at approximately 300° C. Particularly useful for the invention is a cathode sputtering process, particularly a high-frequency cathode sputtering process.

Aside from the optical advantages obtained by virtue of the invention, a contact mask according to the invention also affords various other advantages. Among these is the fact that the mask surface can be cleaned rather simply, for example by vigorous wiping with ordinary cleansing fluids. When using the above-mentioned carrier materials, preferably quartz, and using the same substance as cover material, a maximum constancy and stability of the mask dimensions is afforded. The metallized layer and hence the mask itself attains a considerably longer useful life than heretofore obtainable. When using the mask according to the invention, the mask device as shown in FIG. 1 or FIG. 2 is placed with its top coating 4 facing the photovarnish layer to be exposed. The mask is held in the proper position on the photovarnish layer and consequently in contact with the semiconductor body carrying the varnish layer, by applying any suitable holding pressure such as vacuum or compressed air.

We claim:

1. A reusable contact exposure mask for selective exposure of photovarnish layers for semiconductor fabricating purposes, comprising sequentially an optical transparent carrier plate of glass or quartz, an intermediate layer of optically transparent material harder than said carrier, an optically nontransparent metallized layer deposited upon said intermediate layer and provided with exposure windows, a covering of optically transparent hard material having a thickness of at most 3 micron on the metallized layer.

2. The contact exposure mask of claim 1, wherein at least one of the intermediate and the cover material is selected from quartz, $SiO_2$, $Al_2O_3$, SiC, BeO and hardened glass and the metal layer is selected from chromium, molybdenum and aluminum.

3. The contact exposure mask of claim 1, wherein the metal layer has a thickness of at most 0.5 micron, particularly 0.1 to 0.15 micron.

4. The contact exposure mask of claim 1, wherein the metal layer has a thickness of from 0.1 to 0.15 microns.

5. The contact mask of claim 1, wherein the carrier consists of a polished plate of glass and is provided with a coating of $SiO_2$ which serves as a substrate for the metallized layer that constitutes the mask proper and the metallized layer is covered by a layer of $SiO_2$.

* * * * *